United States Patent
Hwang

(10) Patent No.: US 9,262,955 B2
(45) Date of Patent: Feb. 16, 2016

(54) DISPLAY DEVICE AND DRIVING METHOD THEREOF

(71) Applicant: Samsung Display Co., Ltd., Yongin (KR)

(72) Inventor: Jun-Ho Hwang, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 19 days.

(21) Appl. No.: 14/171,940

(22) Filed: Feb. 4, 2014

(65) Prior Publication Data

US 2015/0091783 A1   Apr. 2, 2015

(30) Foreign Application Priority Data

Oct. 1, 2013   (KR) .................. 10-2013-0117365

(51) Int. Cl.
*G09G 3/00* (2006.01)
*G09G 3/20* (2006.01)

(52) U.S. Cl.
CPC .............. *G09G 3/20* (2013.01); *G09G 2300/08* (2013.01); *G09G 2320/02* (2013.01)

(58) Field of Classification Search
CPC ............. G09G 3/36; G09G 3/30; G09G 3/38; G09G 5/00; G09G 3/3648; G09G 3/3677; G06F 3/038

See application file for complete search history.

(56) References Cited

U.S. PATENT DOCUMENTS

| 7,466,312 | B2 * | 12/2008 | Choi et al. ................... 345/211 |
| 7,633,481 | B2 | 12/2009 | Kim et al. |
| 8,344,970 | B2 | 1/2013 | Fish et al. |
| 2006/0227095 | A1 * | 10/2006 | Kim et al. ................... 345/100 |
| 2012/0249518 | A1 | 10/2012 | Won et al. |
| 2012/0293762 | A1 | 11/2012 | Shin et al. |
| 2013/0082996 | A1 | 4/2013 | Kim et al. |

FOREIGN PATENT DOCUMENTS

KR   10-2008-0018648   2/2008

* cited by examiner

*Primary Examiner* — Michael Faragalla
(74) *Attorney, Agent, or Firm* — H.C. Park & Associates, PLC

(57) ABSTRACT

A display device includes a display panel, a gate driver, a gate clock signal modulating unit, and a gate clock signal generator. The display panel includes gate lines and pixels connected to the gate lines via respective switching elements. The gate driver includes stages configured to output gate signals to the gate lines. The gate clock signal modulating unit is configured to modulate an input gate clock signal based on a scanning start signal to generate an output gate clock signal. The gate clock signal generator is configured to generate a clock signal based on the gate clock signal and output the clock signal to the gate driver. The gate clock signal modulating unit is configured to modulate a width of a pulse of the input gate clock signal overlapping a pulse of the scanning start signal.

20 Claims, 8 Drawing Sheets

DISPLAY DEVICE AND DRIVING METHOD THEREOF

CROSS-REFERENCE TO RELATED APPLICATION

This application claims priority from and the benefit of Korean Patent Application No. 10-2013-0117365, filed on Oct. 1, 2013, which is incorporated by reference for all purposes as if set forth herein.

BACKGROUND

1. Field

Exemplary embodiments relate to a display device and a driving method thereof. More particularly, exemplary embodiments relate to a display device that may improve performance of a gate driver and a driving method thereof.

2. Discussion

A display device, such as a liquid crystal display (LCD), an organic light emitting diode (OLED) display, etc., generally includes a display panel having a plurality of pixels and a plurality of signal lines and a driving unit which drives the display panel. Each pixel typically includes a switching element connected to a signal line, a pixel electrode connected thereto, and a counter electrode. The pixel electrode is connected to the switching element, such as a thin film transistor (TFT), and a data voltage is applied to the pixel electrode. The counter electrode is formed on an entire surface of the display panel and a common voltage Vcom is applied thereto. The pixel electrode and the counter electrode may be disposed on the same substrate or different substrates.

The display device usually receives an input image signal from an external graphic controller or any other suitable source. The input image signal carries luminance information of each pixel and each luminance has a determined number. A data voltage corresponding to desired luminance information is applied to each pixel. The data voltage, which is applied to the pixel, is represented as a pixel voltage depending on a difference from a common voltage, which is applied to the common electrode. The pixel displays a luminance, which is indicated by a gray scale of an image signal. In this manner, to prevent image degradation, which may be caused when electric fields of one direction or voltages having the same polarity are applied for a long time, a polarity of a data voltage for a voltage that is a reference for every frame, every row, every column, or every pixel may be inverted.

A conventional driving unit typically includes a gate driver that supplies a gate signal to a display panel, a data driver that supplies a data signal to the display panel, and a signal controller that controls the data driver and the gate driver. It is noted that the gate driver usually includes a shift register that is formed of a plurality of stages, which are subordinately connected to each other. The gate driver receives a driving voltage and a plurality of gate control signals to generate a gate signal. The driving voltage includes a gate-on voltage, which may turn on a switching element, and a gate-off voltage, which may turn off the switching element. The gate control signals may include a scanning start signal STV that indicates to start the scanning and a gate clock signal CLK that controls an outputting timing of a gate-on pulse. The gate driver generates the gate signal, which is input to a gate line, based on the driving voltage and the gate control signal to output the gate signal to the gate line.

Conventionally, the gate driver and the data driver are mounted on a printed circuit board (PCB) in a form of a chip to be connected to the display panel. Alternatively, a chip of the driving unit may be directly mounted on the display panel. It is also noted that a structure in which a gate driver is integrated into the display panel has been developed. These integrated gate drivers do not require high mobility of a thin film transistor channel as a separate chip.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device and a driving method thereof, which may prevent a potential of a gate signal that is output from a gate driver from being insufficiently lowered. This may, in turn, prevent a charging rate of a display panel from being lowered and deviated, as well as may improve performance of a gate driver and a driving method thereof.

Additional aspects will be set forth in the detailed description which follows, and, in part, will be apparent from the disclosure, or may be learned by practice of the inventive concept.

According to exemplary embodiments, a display device includes a display panel, a gate driver, a gate clock signal modulating unit, and a gate clock signal generator. The display panel includes gate lines and pixels connected to the gate lines via respective switching elements. The gate driver includes stages configured to output gate signals to the gate lines. The gate clock signal modulating unit is configured to modulate an input gate clock signal based on a scanning start signal to generate an output gate clock signal. The gate clock signal generator is configured to generate a clock signal based on the gate clock signal and output the clock signal to the gate driver. The gate clock signal modulating unit is configured to modulate a width of a pulse of the input gate clock signal overlapping a pulse of the scanning start signal.

According to exemplary embodiments, a method of driving a display device includes: modulating an input gate clock signal based on a scanning start signal to generate an output gate clock signal; generating a clock signal based on the output gate clock signal; and generating a gate signal based on the clock signal. Generating the output gate clock signal includes modulating a width of a pulse of the input gate clock signal overlapping a pulse of the scanning start signal.

It is noted that a display device may include several first stages of a gate driver that receive a scanning start signal STV from a signal controller to generate and output a gate signal. A potential of the gate signal may be influenced by an overlapping time of the scanning start signal STV and a gate clock signal CPV. When the potential of the gate signal is not sufficiently high, a charging rate of a pixel that is connected to the corresponding stage may not only be lowered, but may also affect a gate signal at a subsequent stage, such that an overall charging rate of the display panel may be insufficient. According to exemplary embodiments, however, a potential of a gate signal output from a gate driver of a display device may be prevented from being insufficiently lowered, such that a charging rate of the display panel may be prevented from being lowered or deviated. This may, in turn, improve performance of the gate driver and display quality of the display device.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
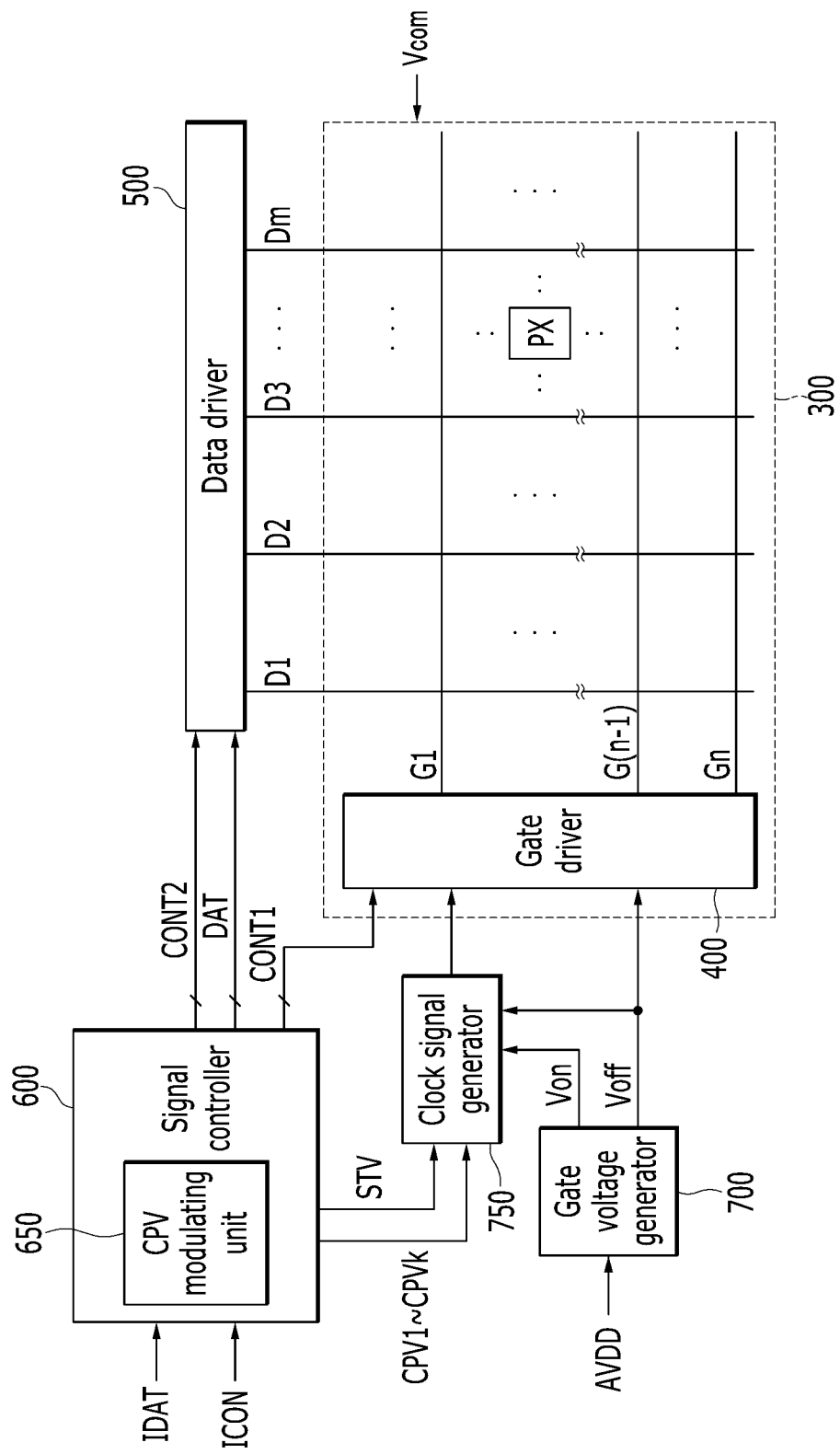
FIG. 1 is a block diagram of a display device, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
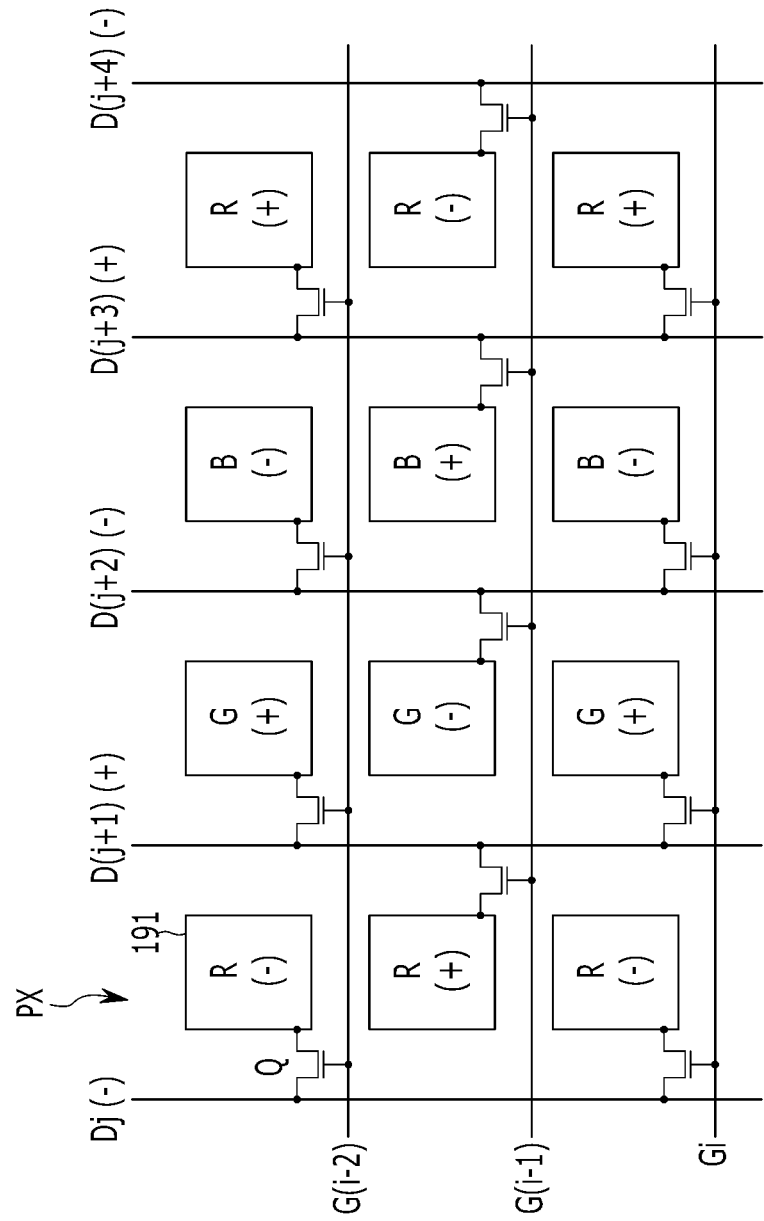
FIG. 2 is a layout view of a pixel and a signal line of a display device, according to exemplary embodiments.

FIG. 1 is a block diagram of a display device, according to exemplary embodiments. FIG. 2 is a layout view of a pixel and a signal line of the display device, according to exemplary embodiments.

Referring to FIG. 1, a display device includes a display panel 300, a gate driver 400 and a data driver 500 that are connected to the display panel 300, a gate voltage generator 700, a clock signal generator 750, and a signal controller 600 that controls the aforementioned components. Although specific reference will be made to this particular implementation, it is also contemplated that the display device may embody many forms and include multiple and/or alternative components. For example, it is contemplated that the components of the display device may be combined, located in separate structures, and/or separate locations.

The display panel 300 includes a plurality of signal lines and a plurality of pixels PX, which are connected to the signal lines and approximately arranged in a matrix formation. It is contemplated, however, that any other suitable formation of pixels PX may be utilized in association with exemplary embodiments described herein. The signal lines include gate lines G1 to Gn (where "n" is a natural number greater than zero), which transmit a gate signal (also referred to as a "scanning signal"), and data lines D1 to Dm (where "m" is a natural number greater than zero), which transmit a data voltage. The gate lines G1 to Gn are parallel (or substantially parallel) to each other and mainly extend in a first (e.g., a row or horizontal) direction. The data lines D1 to Dm are parallel (or substantially parallel) to each other and mainly extend in a second (e.g., a column or vertical) direction crossing the first direction. At least one dummy gate line (not illustrated) may be further arranged at a next row after the gate lines G1 to Gn.

Referring to FIG. 2, a pixel PX may include at least one switching element Q, which is connected to at least one data line D1 to Dm, at least one gate line G1 to Gn, and at least one pixel electrode 191, which is connected to the switching element Q. The switching element Q may include at least one thin film transistor and may be controlled in accordance with a gate signal Vg that is transmitted by the gate line G1 to Gn. In response to receiving the gate signal Vg, the switching element may be configured to transmit a data voltage Vd, which is transmitted by the data line D1 to Dm, to the pixel electrode 191.

To implement a color display, each pixel PX may display one of any suitable color (e.g., spatial division) or each pixel may alternately display the multiple colors as a function of time (e.g., temporal division) to recognize a desired color by spatial and/or temporal sum of the suitable colors. For example, the suitable colors may be primary colors, e.g., three primary colors, such as red, green, and blue, or three primary colors, such as yellow, cyan, and magenta, or four primary colors, etc. A plurality of pixels PX adjacent to each other or not to display different primary colors may form one set (referred to as a dot) and one dot may display a white image.

With continued reference to FIG. 2, an example structure of pixels PX and signal lines of the display panel 300 may include gate lines Gi, G(i−1), etc., which extend mainly in a row direction, and data lines Dj, D(j+1), etc., which mainly extend in a column direction. The pixels PX may be connected at respective intersections of corresponding gate lines Gi, G(i−1), etc., and corresponding data lines Dj, D(j+1), etc. Each pixel PX may include a pixel electrode 191, which is connected to a gate line of the gate lines Gi, G(i+1), etc., and a data line of the data lines Dj, D(j+1), etc., via the switching element Q. Although it has been described that each pixel PX represents primary colors of red R, green G, and blue B, it is contemplated that any suitable color may be utilized.

Pixels PX that represent the same primary color R, G, and B may be disposed in a pixel array. For example, a pixel array of red pixels R, a pixel array of green pixels G, and a pixel array of blue pixels B may be alternately disposed. That is, each data line Dj, D(j+1), etc., may be associated with a pixel array of the same color of pixels PX and every gate line Gi, G(i+1), etc., may be associated with a pixel row of repeating instances of the various colors of pixels PX. It is contemplated, however, that any other suitable arrangement of pixel colors may be utilized in association with exemplary embodiments described herein.

Pixels R, G, and B that are arranged in a pixel array and represent the same primary color may be connected to any one of two adjacent data lines Dj, D(j+1), etc. That is, as illustrated in FIG. 2, the pixels R, G, and B that are disposed in a pixel array may be alternately connected to two adjacent data lines Dj, D(j+1), etc. In this manner, adjacent pixels PX in the column direction may alternate between connects with the two adjacent data lines Dj, D(j+1), etc. The pixels R, G, and B that are disposed in a pixel row may be connected to the same gate line Gi, G(i+1), etc. As such, pixels R, G, and B in the row and column directions may alternate polarities, e.g., alternative between positive (+) and negative (−) polarities.

Adverting to FIG. 1, the data driver 500 is connected to the data lines D1 to Dm and selects a gray voltage based on an output image signal DAT, which is input from the signal controller 600 and applies the gray voltage to the data lines D1 to Dm as a data voltage Vd. The data driver 500 may receive a gray voltage that is generated in a separate gray voltage generator (not illustrated) or receive and divide a limited number of reference gray voltages to generate a gray voltage for an entire gray scale.

The gate driver 400 is connected to the gate lines G1 to Gn to apply a gate signal that is obtained by combining a gate-on voltage Von and a gate-off voltage Voff to the gate lines G1 to Gn. The gate voltage generator 700 receives a driving voltage AVDD from a source (e.g., an external source) to generate the gate-on voltage Von and the gate-off voltage Voff. The gate-on voltage Von may be sent to the clock signal generator 750 and the gate-off voltage Voff may be sent to the clock signal generator 750 and the gate driver 400.

The clock signal generator 750 receives a plurality of gate clock signals CPV1 to CPVk (where "k" is a natural number greater than or equal to two) from the signal controller 600 and receives the gate-on voltage Von and the gate-off voltage Voff from the gate voltage generator 700 to generate a plurality of clock signals, which controls an output timing of the gate-on voltage Von to send the clock signals to the gate driver 400. The clock signal generator 750 may include a level shifter (not shown) that amplifies levels of the gate clock signals CPV1 to CPVk. Each of the plurality of clock signals provided to the gate driver 400 may include a pulse that is synchronized with pulses of the gate clock signals CPV1 to CPVk. A high level of the clock signal provided to the gate driver 400 may be different from a high level of the gate clock signals CPV1 to CPVk.

The signal controller 600 receives an input image signal IDAT and an input control signal ICON from a graphic controller (not illustrated) and controls operations of the clock signal generator 750, the gate driver 400, and the data driver 500. The input image signal IDAT carries luminance information of each pixel PX and the luminance has a determined number of gray scales, for example, $1024=2^{10}$, $256=2^8$, or $64=2^6$ gray scales. The input image signals IDAT may be provided for each color that is represented by the pixels PX. Examples of input control signals ICON include a vertical synchronization signal, a horizontal synchronization signal, a main clock signal, a data enable signal, and the like. In exemplary embodiments, the signal controller 600 processes an input image signal IDAT based on the input image signal IDAT and the input control signal ICON to convert the input image signal IDAT into an output image signal DAT and to generate a gate control signal CONT1 and a data control signal CONT2.

With continued reference to FIG. 1, the signal controller 600 may include a gate clock signal (CPV) modulating unit 650 that modulates an initial gate clock signal to generate a gate clock signal CPV1 to CPVk. The gate clock signal modulating unit 650 will be described below in more detail.

The various driving devices of the display device may be mounted on the display panel 300 in a form of at least one integrated circuit (IC) chip or mounted on a flexible printed circuit film (not illustrated) that is attached to the display panel 300 in a form of a tape carrier package (TCP) or mounted on a separate printed circuit board (PCB) (not illustrated). It is also contemplated that the various driving devices may be integrated as part of the display panel 300 together with the signal lines (e.g., the gate lines G1 to Gn and the data lines D1 to Dm) and the thin film transistors. For instance, the gate driver 400 may be integrated in the display panel 300 or formed by the same process utilized to form the switching elements Q of the pixels PX.

In exemplary embodiments, the gate driver 400, the data driver 500, the signal controller 600, the gate voltage generator 700, the clock signal generator 750, and/or one or more components thereof, may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like.

According to exemplary embodiments, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. In this manner, the gate driver 400, the data driver 500, the signal controller 600, the gate voltage generator 700, the clock signal generator 750, and/or one or more components thereof may include or otherwise be associated with one or more memories (not shown) including code (e.g., instructions) configured to cause the gate driver 400, the data driver 500, the signal controller 600, the gate voltage generator 700, the clock signal generator 750, and/or one or more components thereof to perform one or more of the features, functions, processes, etc., described herein.

The memories may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CDRW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

An exemplary operation of the display device will be described in more detail.

According to exemplary embodiments, the signal controller 600 receives an input image signal IDAT and an input control signal ICON, which is controlled to display the input image signal IDAT, from a graphic controller, such as an external graphic controller (not illustrated).

The signal controller 600 processes the input image signal IDAT in accordance with an operating condition of the display panel 300 based on the input image signal IDAT and the input control signal ICON and generates a gate control signal CONT1 and a data control signal CONT2. The gate control signal CONT1 includes a scanning start signal STV that instructs when to start scanning and gate clock signals CPV1 to CPVk. The gate control signal CONT1 may further include an output enable signal OE that limits the duration of the gate-on voltage Von. The data control signal CONT2 includes a horizontal synchronization start signal STH that notifies that transmission of the output image signal DAT for a row of pixels PX is to start, a load signal TP that allows a data voltage Vd to be applied to the data lines D1 to Dm, and a data clock signal HCLK. The data control signal CONT2 may further include an inversion signal RVS that inverts a polarity of the data voltage Vd with respect to a common voltage Vcom.

The signal controller 600 sends the gate control signal CONT1 to the gate driver 400 and sends the data control signal CONT2 and the processed output image signal DAT to the data driver 500. Further, the signal controller 600 sends a plurality of gate clock signals CPV1 to CPVk and the scanning start signal STV to the clock signal generator 750. The clock signal generator 750 generates a plurality of clock signals based on the gate clock signals CPV1 to CPVk and the scanning start signal STV (which are input from the signal controller 600) and the gate-on voltage Von and the gate-off voltage Voff (which are input from the gate voltage generator 700) and sends the plurality of clock signals to the gate driver 400.

The data driver 500 receives the output image signal DAT for a row of pixels PX in accordance with the data control signal CONT2 from the signal controller 600 and selects a gray voltage corresponding to each of the output image signals DAT so as to convert the output image signal DAT (which is a digital signal) into a data voltage Vd (which is an analog data signal). The data driver 500 applies the data voltage Vd to the data lines D1 to Dm.

The gate driver 400 receives the gate control signal CONT1 input from the signal controller 600, the plurality of clock signals input from the clock signal generator 750, and the gate-off voltage Voff input from the gate voltage generator 700 to generate a gate signal that is configured by the gate-on voltage Von and the gate-off voltage Voff. The gate driver 400 applies (e.g., sequentially applies) the gate-on voltage Von to the gate lines G1 to Gn to turn on the switching elements Q that are connected to the gate lines G1 to Gn. In this manner, the data voltage Vd that is applied to the data lines D1 to Dm is applied to the corresponding pixels PX of a row of pixels PX through the turned-on switching elements Q.

In exemplary embodiments, a difference between the data voltage Vd that is applied to the pixels PX and the common voltage Vcom is represented as a pixel voltage of the corresponding pixel PX. A luminance of the image may be represented in accordance with the pixel voltage.

The aforementioned procedure is repeated in the unit of a horizontal period 1H so that the gate-on voltage Von may be sequentially applied to each of the gate lines G1 to Gn to apply the data voltage Vd to each of the pixels PX to display an image for a frame. A next frame starts at the end of one frame and a status of an inversion signal RVS, which is applied to the data driver 500, may be controlled such that a polarity of the data voltage Vd that is applied to each of the pixels PX is opposite to a polarity of a previous frame (which may be referred to as "frame inversion").

As seen in FIG. 2, data voltages having opposite polarities may be applied to adjacent data lines Dj, D(j+1), etc. In this manner, data voltages Vd having opposite polarities may be applied to pixels R, G, and B, which are adjacent in a column direction and data voltages Vd having opposite polarities may be applied to the pixels R, G, and B, which are adjacent to each other in a row direction, so as to be driven in the form of approximately one-by-one dot inversion. That is, even though the data voltage Vd that is applied to the data lines Dj, D(j+1), etc., maintains the same polarity for a frame, the image may be displayed by a dot inversion type driving scheme.

The gate driver 400 is described in more detail with reference to FIGS. 3 and 4.

Figure 3:
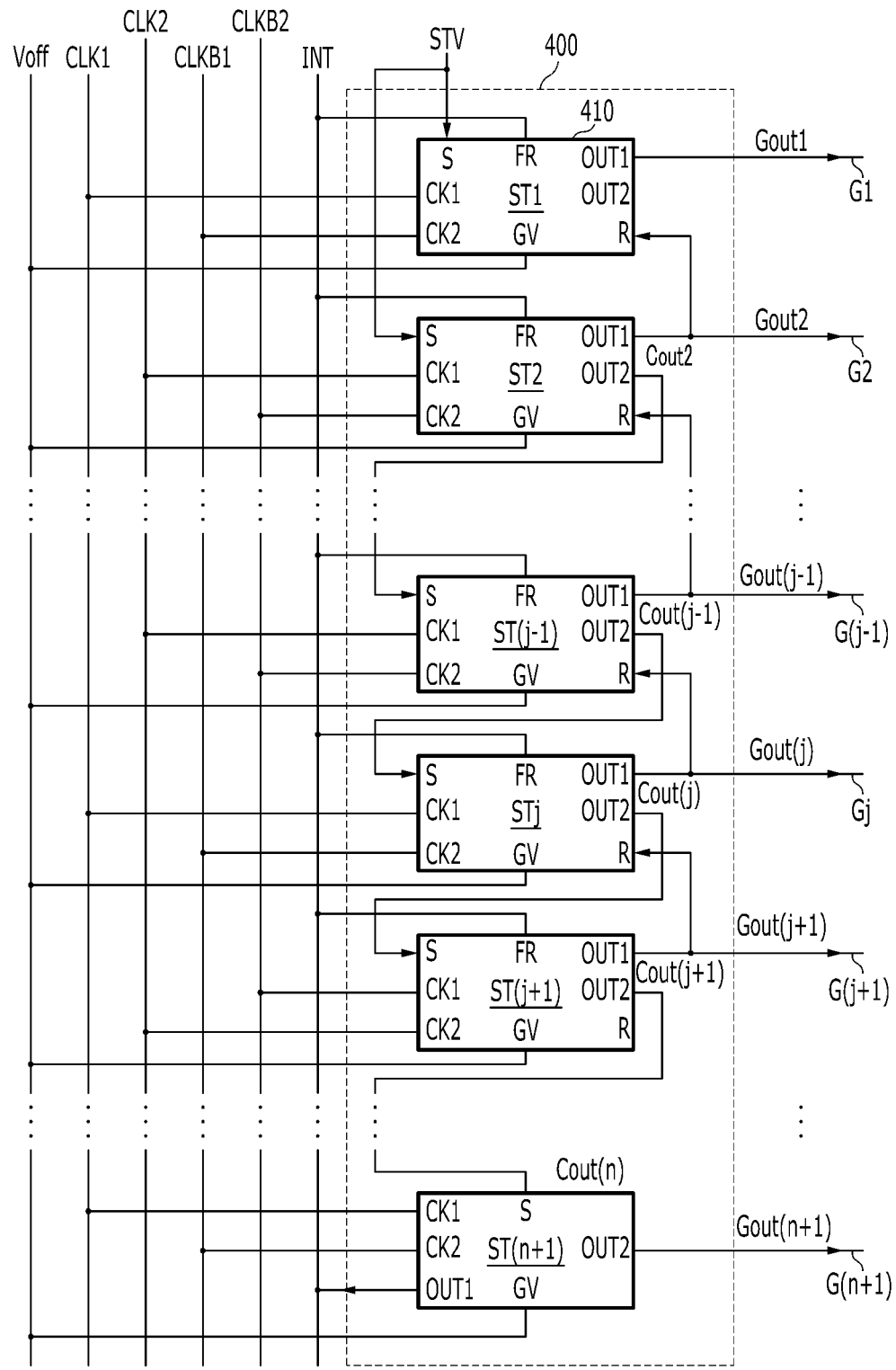
FIG. 3 is a block diagram of a gate driver of a display device, according to exemplary embodiments.

FIG. 3 is a block diagram of a gate driver of the display device, according to exemplary embodiments. FIG. 4 is an example of a circuit diagram of a stage of a shift register of the gate driver illustrated in FIG. 3, according to exemplary embodiments.

According to exemplary embodiments, the gate driver 400 may be implemented as a shift register that includes a plurality of stages 410 arranged in a line and connected to the gate lines G1 to Gn, respectively. The scanning start signal STV, an initializing signal INT, a plurality of clock signals CLK1, CLKB1, CLK2, and CLKB2, and the gate-off voltage Voff are input to the gate driver 400. The plurality of clock signals CLK1, CLKB1, CLK2, and CLKB2 may include k pairs (where "k" is a natural number of 2≤k<n) of clock signals. As seen in FIG. 3, two pairs of clock signals CLK1, CLKB1, CLK2, and CLKB2 are input to the gate driver 400. It is contemplated that any other suitable arrangement may be utilized.

Each stage 410 may include a set terminal S, a gate voltage terminal GV, clock terminals CK1 and CK2, a reset terminal R, a frame reset terminal FR, a gate output terminal OUT1, and a carry output terminal OUT2. The last stage ST(n+1) may be a dummy stage. The dummy stage does not include the reset terminal R or the frame reset terminal FR.

A carry signal of a previous stage ST(j−1), that is, a previous stage carry signal Cout(j−1), is input to a set terminal S of each stage, for example, the j-th stage STj. A gate signal of a subsequent stage ST(j+1), that is, a subsequent stage gate signal Gout(j+1) is input to the reset terminal R if each stage, for example, the j-th stage STj. The clock signals CLK1 and CLKB1 or the clock signals CLK2 or CLKB2 are input to the clock terminals CK1 and CK2, whereas the gate-off voltage Voff is input to the gate voltage terminal GV. The gate output terminal OUT1 sends the gate signal Gout(j) and the carry output terminal OUT2 sends the carry signal Cout(j).

The scanning start signal STV is input to the first k stages of the shift register, instead of the previous stage carry signal of a previous stage. As seen in FIG. 3, the scanning start signal STV is input to the first two stages ST1 and ST2. Further, different pairs of clock signals may be input to the clock terminals CK1 and CK2 of the first k stages ST1 and ST2 of the shift register. For example, the clock signals CLK1 and CLKB1 may be input to the first stage ST1 and the clock signals CLK2 and CLKB2 may be input to the second stage ST2.

When the clock signal CLK1 is input to a clock terminal CK1 of a j-th stage STj and the clock signal CLKB1 is input to a clock terminal CK2, a clock signal CLK2 may be input to a clock terminal CK1 of a (j−1)-th stage ST(j−1), which is adjacent to the j-th stage STj, and the clock signal CLKB2 may be input to the clock terminal CK2. Further, the clock signal CLKB2 may be input to a clock terminal CK1 of a (j+1)-th stage ST(j+1) and the clock signal CLK2 may be input to the clock terminal CK2 of the (j+1)-th stage ST(j+1).

Each clock signal CLK1, CLKB1, CLK2, and CLKB2 may be same as the gate-on voltage Von when the voltage level is at a relatively high state and may be same as the gate-off voltage Voff when the voltage level is at a relatively low state so as to drive the switching element Q of a pixel PX. A phase difference between the clock signals CLK1 and CLK2 may be larger than 0 degrees and smaller than 180 degrees. A phase difference of the clock signals CLK1 and CLK1B may be 180 degrees and a phase difference between clock signals CLK2 and CLK2B may be 180 degrees.

Figure 4:
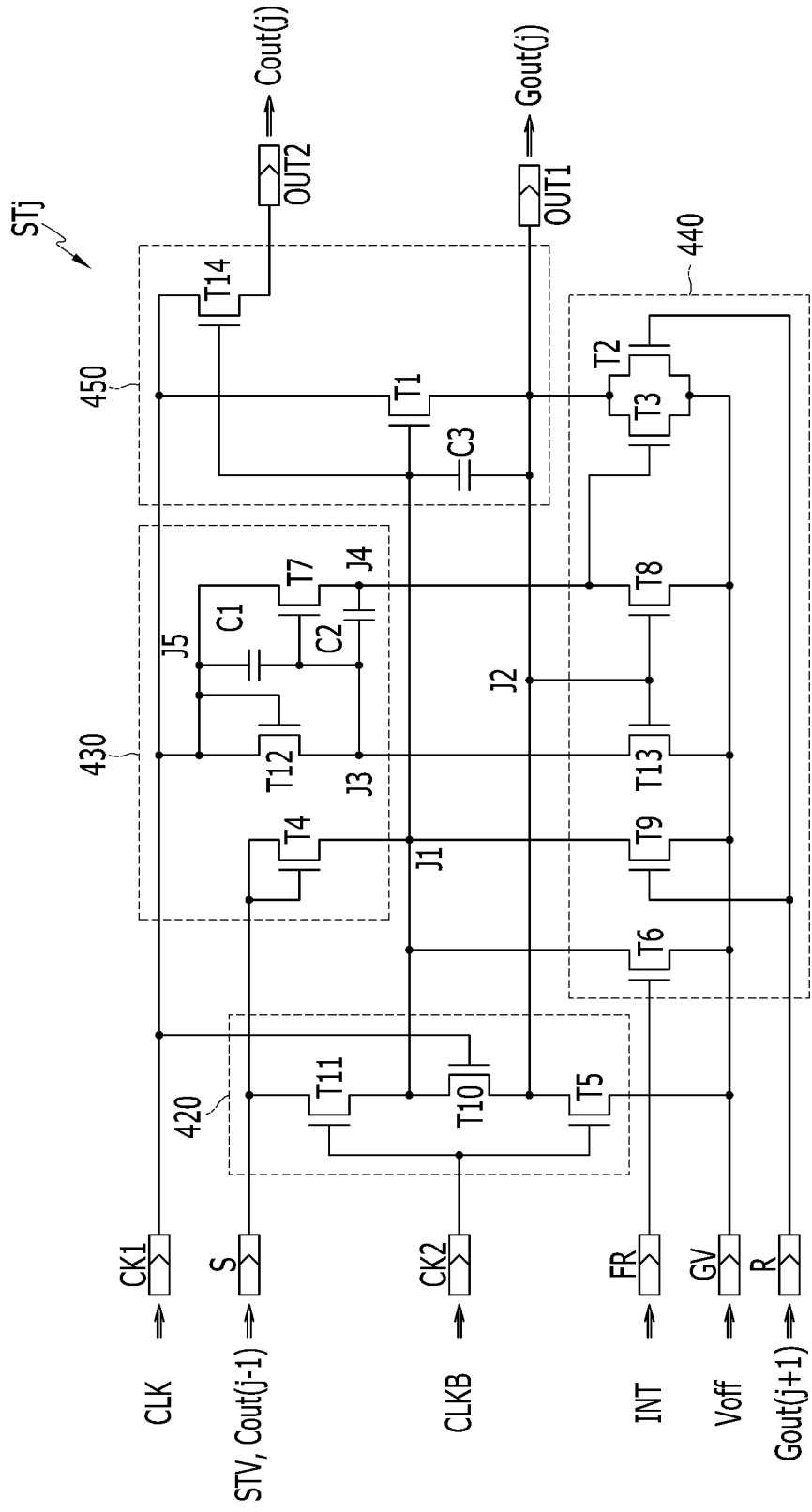
FIG. 4 is an example of a circuit diagram of a stage of a shift register of the gate driver illustrated in FIG. 3, according to exemplary embodiments.

Referring to FIG. 4, each stage, for example, a j-th stage STj, of the gate driver 400 may include an input section 420, a pull up driver 430, a pull down driver 440, and output section 450. The aforementioned portions of each stage may include at least one transistor (e.g., transistors T1 to T14) and the pull up driver 430 and the output section 450 may further include at least one capacitor (e.g., capacitors C1 to C3). The capacitors C1 to C3 may be a parasitic capacitance between a gate and a drain/source which is formed during a manufacturing process.

Before proceeding any further, it is noted that the respective source and drain terminals of the various transistors T1 to T14 may be configured in the correspondingly opposite configuration as described herein. That is, a terminal described as a source may alternatively function as a drain and a terminal described as a drain may alternatively function as a source. In this manner, any suitable configuration of the transistors may be utilized in association with exemplary embodiments described herein.

The input section 420 may include three transistors T11, T10, and T5 that are sequentially connected to the set terminal S and the gate voltage terminal GV in series. Gates of the transistors T11 and T5 are connected to the clock terminal CK2 and a gate of the transistor T10 is connected to the clock terminal CK1. A contact between the transistor T11 and the transistor T10 is connected to a contact J1 and a contact between the transistor T10 and the transistor T5 is connected to a contact J2.

The pull up driver 430 may include a transistor T4 that is connected between the set terminal S and the contact J1, a transistor T12 that is connected between the clock terminal CK1 and a contact J3, and a transistor T7 that is connected between the clock terminal CK1 and a contact J4. A gate and a drain of the transistor T4 are commonly connected to the set terminal S, whereas a source of the transistor T4 is connected to the contact J1. A gate and a drain of the transistor T12 are commonly connected to the clock terminal CK1, whereas a source of the transistor T12 is connected to the contact J3. A gate of the transistor T7 is connected to the contact J3 and also connected to the clock terminal CK1 through the capacitor C1. A drain of the transistor T7 is connected to the clock terminal CK1, whereas a source is connected to the contact J4. The capacitor C2 is connected between the contact J3 and the contact J4.

The pull down driver 440 may include a plurality of transistors T6, T9, T13, T8, T3, and T2 which receive the gate-off voltage Voff through respective sources to output the gate-off voltage Voff to the contacts J1, J3, J2, and J4 through respective drains. A gate of the transistor T6 is connected to the frame reset terminal FR and a drain of the transistor T6 is connected to the contact J1. A gate of the transistor T9 is connected to the reset terminal R and a drain of the transistor T9 is connected to the contact J1. Gates of the transistors T13 and T8 are commonly connected to the contact J2 and drains of the transistors T13 and T8 are connected to the contacts J3 and J4, respectively. A gate of the transistor T3 is connected to the contact J4, a gate of the transistor T2 is connected to the reset terminal R, and drains of the transistors T3 and T2 are commonly connected to the contact J2.

The output section 450 includes transistors T1 and T14 whose drains and sources are connected to the clock terminal CK1 and between the output terminals OUT1 and OUT2, respectively. The gates of the transistors T1 and T14 are connected to the contact J1. A capacitor C3 is connected between the gate and the drain of the transistor T1; that is, between the contact J1 and the contact J2. A drain of the transistor T1 is also connected to the contact J2.

In FIG. 4, for the convenience of illustration, the clock signals CLK1 and CLK2, which are input to the clock terminal CK1 are representatively illustrated as a clock signal CLK, and the clock signals CLKB1 and CLKB2, which are input to the clock terminal CK2 are representatively illustrated as a clock signal CLKB.

An exemplary operation of the stages will be described with reference to FIG. 4.

For better comprehension and ease of description, a voltage corresponding to a relatively high level of the clock signals CLK and CLKB is referred to as a high voltage and an amplitude of the voltage corresponding to the relatively low level of the clock signals CLK and CLKB is equal to the gate-off voltage Voff and referred to as a low voltage.

In a first state, the clock signal CLKB and the previously stage carry signal Cout(j−1) become high, such that the transistors T11, T5 and T4 are turned on. In this manner, transistors T11 and T4 transmit the high voltage to the contact J1 and the transistor T5 transmits the low voltage to the contact J2. As such, the transistors T1 and T14 are turned on to output the clock signal CLK to the output terminals OUT1 and OUT2. Both a voltage of the contact J2 and the clock signal CLK are low voltages, such that the output signals Gout(j) and Cout(j) become a low voltage. Simultaneously, the capacitor C3 charges a voltage corresponding to a difference between the high voltage and the low voltage. To this end, the clock signal CLK and the subsequent stage gate signal Gout(j+1) are low and the contact J2 is also low, such that all the transistors T10, T9, T12, T13, T8, and T2 to which the gate is connected are in an off state.

When the clock signal CLKB becomes low, the transistor T11 and T5 are turned off. As such, when the clock signal CLK becomes high, an output voltage of the transistor T1 and a voltage of the contact J2 become high voltages. In this manner, even though a high voltage is applied to the gate of the transistor T10, a potential of the source that is connected to the contact J2 becomes the same high voltage so that a potential difference between the gate and the source becomes zero, and, thus, the transistor T10 is maintained in a turned-off state. As such, the contact J1 is in a floating state and the potential thereof is increased to the high voltage by the capacitor C3.

In the meantime, the clock signal CLK and the potential of the contact J2 are a high voltage, such that the transistors T12, T13, and T8 are turned on. In this manner, the transistor T12 and the transistor T13 are connected in series between the high voltage and the low voltage, and, thus, a potential of the contact J3 has a voltage value that is divided by a resistance in a resistant state when the two transistors T12 and T13 are turned on. However, if the resistance in the resistant state when the transistors T12 and T13 are turned on is set to be much higher than a resistance in a resistant state when the transistor T12 is turned on, the voltage of the contact J3 may be substantially equal to the high voltage. As such, the transistor T7 is turned on to be connected to the transistor T8 in series, and, thus, a potential of the contact J4 has a voltage value which is divided by a resistance in a resistant state when the transistors T7 and T8 are turned on. In this manner, if the resistances of the resistant state of the transistors T7 and T8 are set to be substantially equal to each other, the potential of the contact J4 has a medium value between the high voltage and the low voltage, and, thus, the transistor T3 is maintained to be turned off. As such, the subsequent stage gate signal Gout(j+1) is still low, such that the transistors T9 and T2 are also maintained in a turned off state. To this end, the output terminals OUT1 and OUT2 are connected to the clock signal CLK, but are blocked from the low voltage so as to send a high voltage.

In the meantime, the capacitor C1 and the capacitor C2 charge a voltage corresponding to a potential difference at both ends and a voltage of the contact J3 is lower than a voltage of the contact J5.

When the subsequent stage gate signal Gout(j+1) and the clock signal CLKB become high and the clock signal CLK becomes low, the transistors T9 and T2 are turned on to transmit a low voltage to the contacts J1 and J2. In this manner, the voltage of the contact J1 drops to a low voltage and discharges the capacitor C3, such that a determined time is required to completely drop the voltage to the low voltage due to the discharging time of the capacitor C3. As such, the transistors T1 and T14 are maintained in a turned on state for a while even when the subsequent stage gate signal Gout(j+1) becomes high, and, thus, the output terminals OUT1 and OUT2 are connected to the clock signal CLK to send the low voltage. When the capacitor C3 is completely discharged, such that the potential of the contact J1 reaches a low voltage, the transistor T14 is turned off and the output terminal OUT2 is blocked from the clock signal CLK, such that the carry signal Cout(j) becomes in a floating state to maintain the low voltage. To this end, the output terminal OUT1 is simultaneously connected to the low voltage through the transistor T2 even when the transistor T1 is turned off to continuously send the low voltage.

In the meantime, the transistors T12 and T13 are turned off, such that the contact J3 becomes in a floating state. Further, the voltage of the contact J5 becomes lower than the voltage of the contact J4, and the voltage of the contact J3 is maintained to be lower than the voltage of the contact J5 by the capacitor C1, such that the transistor T7 is turned off. In this manner, the transistor T8 is simultaneously turned off, such that the voltage of the contact J4 is lowered by the amount, such that the transistor T3 is also maintained in a turned off state. It is also noted that the gate of the transistor T10 is connected to the low voltage of the clock signal CLK and the voltage of the contact J2 is low, such that the transistor T10 is maintained in a turned off state.

When the clock signal CLK becomes high, the transistors T12 and T7 are turned on and the voltage of the contact J4 is increased, such that the transistor T3 is turned on to send the low voltage to the contact J2, and, thus, the output terminal OUT1 continuously sends the low voltage. That is, even though the output of the subsequent stage gate signal Gout(j+1) is low, the voltage of the contact J2 may be a low voltage.

In the meantime, the gate of the transistor T10 is connected to the high voltage of the clock signal CLK and the voltage of the contact J2 is a low voltage, such that the low voltage of the contact J2 is transmitted to the contact J1. In this manner, the clock terminal CK1 is connected to the drains of the transistors T1 and T14, such that the clock signal CLK is continuously applied thereto. That is, the transistor T1 is manufactured to be larger than the other transistors so that a parasitic capacitance between the gate and the drain is relatively large so that a change in the voltage of the drain may affect the voltage of the gate. To this end, when the clock signal CLK becomes high, the voltage of the gate is increased due to the parasitic capacitance between the gate and the drain, such that the transistor T1 may be turned on. In this manner, the low voltage of the contact J2 is transmitted to the contact J1, such that the voltage of the gate of the transistor T1 is maintained to be low, which may prevent the transistor T1 from being turned on.

Subsequently, the voltage of the contact J1 is maintained to be low until the previous stage carry signal Cout(j−1) becomes high. The voltage of the contact J2 becomes a low voltage through the transistor T3 when the clock signal CLK is high and the clock signal CLKB is low. In contrast, the voltage of the contact J2 is maintained to be low via the transistor T5.

In the meantime, the transistor T6 receives the initializing signal INT, which is generated by a last dummy stage ST(n+1) and transmits the gate-off voltage Voff to the contact J1 so as to set the voltage of the contact J1 to be a low voltage once again. In this manner, the stage STj generates the carry signal Cout(j) and the gate signal Gout(j) based on the previous stage carry signal Cout(j−1) and the subsequent stage gate signal Gout(j+1) and in synchronization with the clock signals CLK and CLKB.

According to exemplary embodiments, the structure and the operation of the stage STj described above may be configured in any other suitable form. As such, exemplary embodiments may be configured and/or operate in other forms to achieve exemplary embodiments described herein.

The signal controller 600 is described in more detail with reference to FIGS. 5 and 6, as well as one or more of the other aforementioned drawings.

Figure 5:
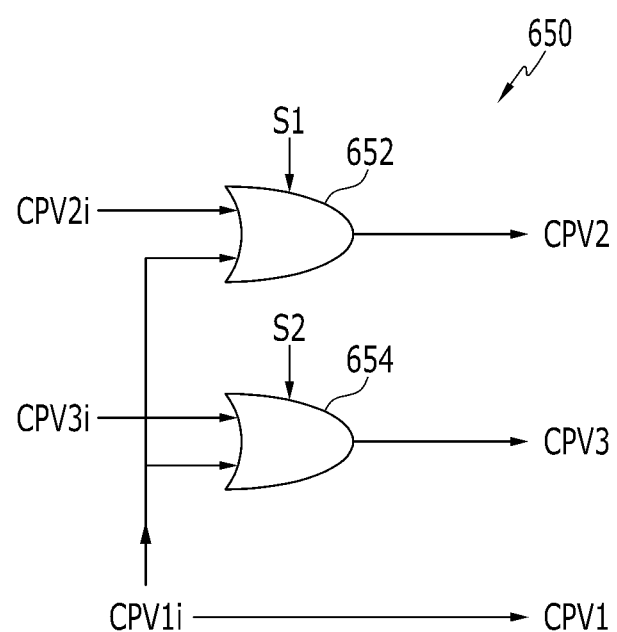
FIG. 5 is a block diagram of a gate clock signal (CPV) modulating unit of a display device, according to exemplary embodiments.

FIG. 5 is a block diagram of a gate clock signal (CPV) modulating unit of the display device, according to exemplary embodiments. FIG. 6 is a timing chart before and after modulating a driving signal that is modulated by the gate clock signal modulating unit, according to exemplary embodiments.

Referring to FIG. 5, the signal controller 600 may include a gate clock signal (CPV) modulating unit 650. It is contemplated, however, that the gate clock signal modulating unit 650 may not be included in signal controller 600, but, instead, may be separately provided.

According to exemplary embodiments, the gate clock signal modulating unit 650 receives k initial gate clock signals (e.g., initial gate clock signals CPV1i, CPV2i, and CPV3i), which are digital signals having a high level and a low level, from a gate clock signal generator (not illustrated). In this manner, the gate clock signal modulating unit 650 modulates the k initial gate clock signals CPV1i, CPV2i, and CPV3i to generate and output k gate clock signals (e.g., gate clock signals CPV1, CPV2, and CPV3). It is to be appreciated that the present exemplary embodiment is an example in which k is 3, however, it is contemplated that k may be any suitable number greater than or equal to 2.

The initial gate clock signal includes a first initial gate clock signal CPV1i and at least one second initial gate clock signal CPV2i and CPV3i. A phase of the first initial gate clock signal CPV1i is faster than a phase of the at least one second initial gate clock signal CPV2i and CPV3i. Further, when a plurality of second initial gate clock signals CPV2i and CPV3i are present, phases of the plurality of second initial gate clock signals CPV2i and CPV3i may be different from each other. FIGS. 5 and 6 illustrate an example in which the second initial gate clock signals CPV2i and CPV3i are two; however, it is contemplated that any suitable number of second initial gate clock signals greater than zero may utilized.

The gate clock signals CPV1, CPV2, and CPV3 include a first gate clock signal CPV1 corresponding to the first initial gate clock signal CPV1i and at least one second gate clock signal CPV2 and CPV3 corresponding to the second initial gate clock signals CPV2i and CPV3i. In this manner, the number of output gate clock signals may correspond to the number of input initial gate clock signals.

According to exemplary embodiments, a width of at least a part of the plurality of gate clock signals CPV1, CPV2, and CPV3, for example, a pulse that overlaps a high period of the scanning start signal STV among pulses of the second gate clock signals CPV2 and CPV3 is independently adjusted from the remaining period. For example, a rising time of the at least a part of the plurality of gate clock signals CPV1, CPV2, and CPV3, for example, a pulse that overlaps a high period of the scanning start signal STV of each of the second gate clock signals CPV2 and CPV3 may be independently adjusted from the remaining portion(s) of the period.

More specifically, according to exemplary embodiments, the width of the pulse of the second gate clock signals CPV2 and CPV3 that overlaps the high period of the scanning start signal STV is adjusted to be larger than the pulse width of the remaining period so that the high period of the scanning start signal STV and the overlapping period of the pulses of the second gate clock signal CPV2 and CPV3 may be increased.

According to exemplary embodiments, in a period that does not overlap the high period of the scanning start signal STV, a waveform and a phase of the second gate clock signals CPV2 and CPV3 may be equal (or substantially equal) to a waveform and a phase of the second initial gate clock signals CPV2i and CPV3i. Further, the first gate clock signal CPV1 may be equal to the first initial gate clock signal CPV1i; however, it is contemplated that a width of the pulse of the first initial gate clock signal CPV1i that overlaps the high period of the scanning start signal STV may be independently modulated from the remaining portion(s) of the period.

Referring to FIG. 5, the gate clock signal modulating unit 650 may include one or more OR circuits 652 and 654. For example, when two initial gate clock signals CPV1i and CPV2i are input, the gate clock signal modulating unit 650 may include one OR circuit 652, and when three initial gate clock signals CPV1i, CPV2i, and CPV3i are input, the gate clock signal modulating unit 650 may include two OR circuits 652 and 654. As such, when the number of initial gate clock signals CPV1i to CPVki is k, the gate clock signal modulating unit 650 may include k−1 OR circuits. In the present exemplary embodiment illustrated in FIG. 5, an example in which three initial gate clock signals CPV1i, CPV2i, and CPV3i are input to the gate clock signal modulating unit 650 will be described, such that two OR circuits 652 and 654 are present.

The OR circuit 652 receives the first initial gate clock signal CPV1i and the second initial gate clock signal CPV2i. The OR circuit 652 outputs a second gate clock signal CPV2 that is modulated by logical summation of the first and second initial gate clock signals CPV1i and CPV2i in accordance with the control of the control signal S1. In exemplary embodiments, the control signal S1 may be a scanning start signal STV or a signal that is synchronized with the scanning start signal STV.

Figure 6:
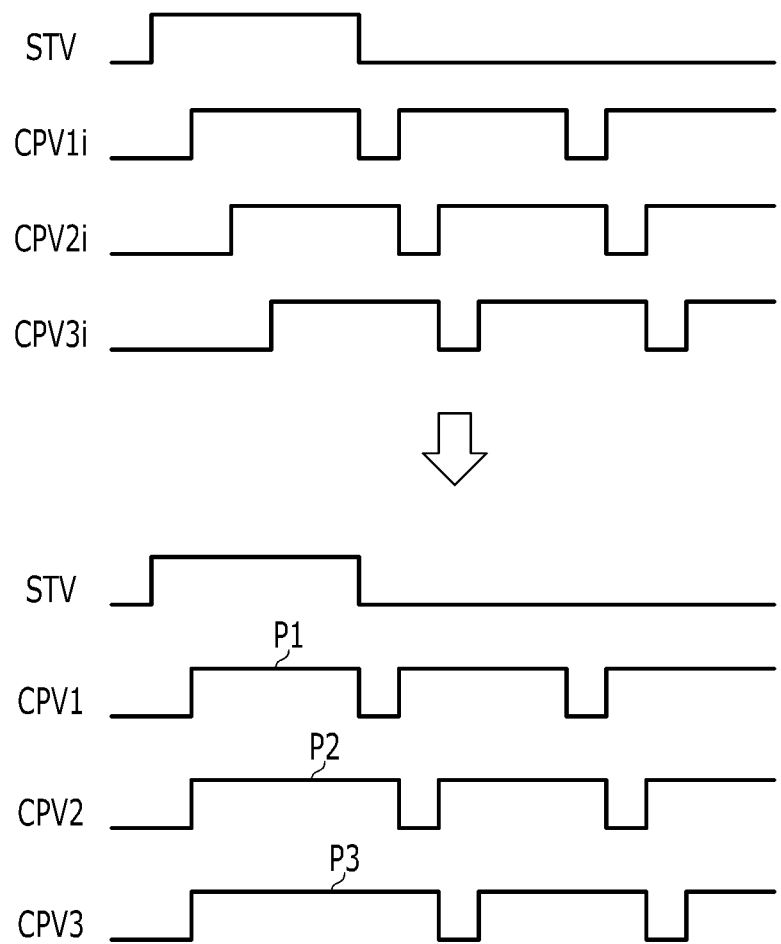
FIG. 6 is a timing chart before and after modulating a driving signal that is modulated by the gate clock signal modulating unit, according to exemplary embodiments.

Referring to FIG. 6, if the control signal S1 is a signal that is synchronized with the scanning start signal STV, the OR circuit 652 operates as an OR circuit only in a period when the scanning start signal STV is high. That is, the OR circuit 652 may output the second gate clock signal CPV2 having a pulse P2 that is modulated by logically summing the first and second initial gate clock signals CPV1i and CPV2i, which are input only during a period when the scanning start signal STV is high. In this manner, a rising time of the pulse P2 of the second gate clock signal CPV2 may be synchronized with a rising time of the pulse P1 of the first gate clock signal CPV1 in a period when the scanning start signal STV is high. As such, a length of an overlapping period of a high period of the scanning start signal STV and the pulse P2 of the second gate clock signal CPV2 may be equal to a length of an overlapping period of the high period of the scanning start signal STV and the pulse P1 of the first gate clock signal CPV1.

The OR circuit 654 receives the first initial gate clock signal CPV1i and the second initial gate clock signal CPV3i. The OR circuit 654 outputs a second gate clock signal CPV3 that is modulated by logically summing the first and second initial gate clock signals CPV1*i* and CPV3*i* in accordance with the control of the control signal S2. In exemplary embodiments, the control signal S2 may be the scanning start signal STV or a signal that is synchronized with the scanning start signal STV.

Referring to FIG. 6, if the control signal S2 is a signal that is synchronized with the scanning start signal STV, the OR circuit 654 operates as an OR circuit only in a period when the scanning start signal STV is high. That is, the OR circuit 654 may output the second gate clock signal CPV3 having a pulse P3 that is modulated by logically summing the first and second initial gate clock signals CPV1*i* and CPV3*i*, which are input only during a period when the scanning start signal STV is high. In this manner, a rising time of the pulse P3 of the second gate clock signal CPV3 may be synchronized with a rising time of the pulse P1 of the first gate clock signal CPV1 in a period when the scanning start signal STV is high. As such, a length of an overlapping period of the high period of the scanning start signal STV and the pulse P3 of the second gate clock signal CPV3 may be equal to a length of an overlapping period of the high period of the scanning start signal STV and the pulse P1 of the first gate clock signal CPV1.

According to exemplary embodiments, the first and second gate clock signals CPV1, CPV2, and CPV3 that are generated as described above are input to the above-described clock signal generator 750 and amplified as clock signals CLK1, CLKB1, CLK2, and CLKB2 to be input to the gate driver 400.

When the scanning start signal STV is applied to the set terminals S of first some stages 410 to which the pulse of the scanning start signal STV is input, among the plurality of stages 410 of the gate driver 400 as described in FIGS. 3 and 4, the transistor T1 is turned on through the turned-on transistor T4 and the capacitor C3 charges a voltage as high as the difference between the low voltage Voff and the high voltage.

When the clock signal CLK becomes high in a state when the pulse of the scanning start signal STV is applied to the set terminal S, the high voltage is applied to the contact J2 through the turned-on transistor T1. In this manner, a potential of the floating contact J1 is increased by the capacitor C3 and the output of the gate signal Gout(j) may be increased as much as the increased potential of the contact J1. The amount of the increased potential of the contact J1 is increased as a high period of the pulse of the scanning start signal STV, and a high period of a pulse of the clock signal CLK, which overlaps the scanning start signal STV, is increased.

According to exemplary embodiments, when the plurality of gate clock signals CPV1, CPV2, and CPV3 are used, a length of an overlapping period of the high period of the scanning start signal STV and the pulses P2 and P3 of the second gate clock signals CPV2 and CPV3 may be independently adjusted so as to be equal or equivalent to a length of an overlapping period of the high period of the scanning start signal STV and the pulse P1 of the first gate clock signal CPV1, such that the output voltage of the gate signal Gout(j) may be sufficiently increased. In this manner, performance of the gate driver 400 may be improved and a situation in which a charging rate of pixels PX that are connected to second or later stages 410 among the first several stages 410 to which the pulse of the scanning start signal STV is input is lower than the charging rate of the pixel PX that is connected to the first stage 410 may be prevented. Further, the carry signal from the second or later stages 410 among the first several stages 410 to which the pulse of the scanning start signal STV is input may also have a sufficient potential, such that the charging rate of the pixel PX, which is connected to the subsequent stages 410 that receives the carry signal, may be prevented from being lowered. Moreover, the potential of the gate-on voltage Von of the gate signal, which is input to the overall display panel 300, may be sufficiently increased, such that issues with a display device that may otherwise be caused by the lowering of the charging rate of the overall display panel 300 or the deviation of the charging rate may be prevented (or at least reduced).

Figure 7:
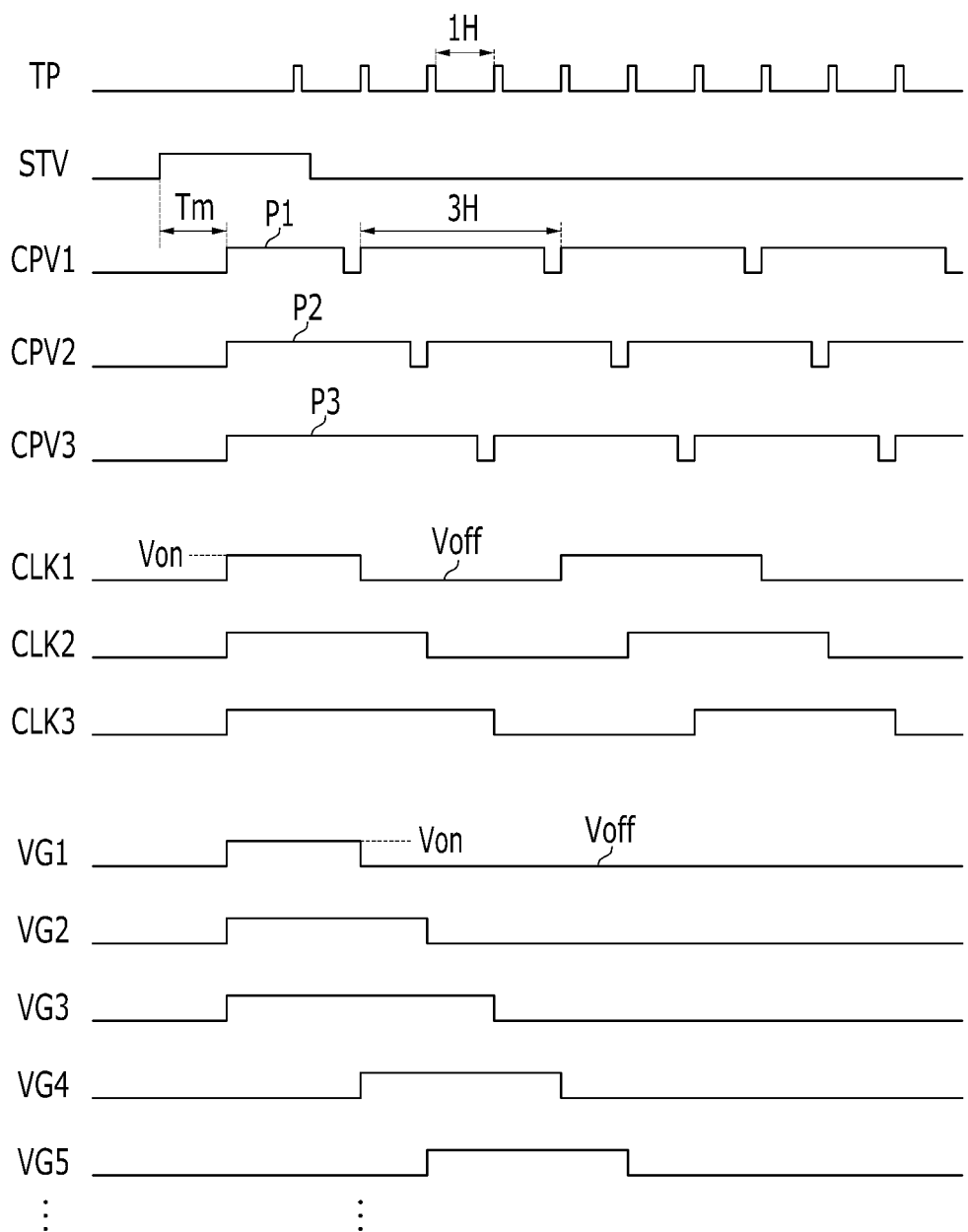
FIGS. 7 and 8 are timing charts of a driving signal of a display device, according to exemplary embodiments.
Figure 8:
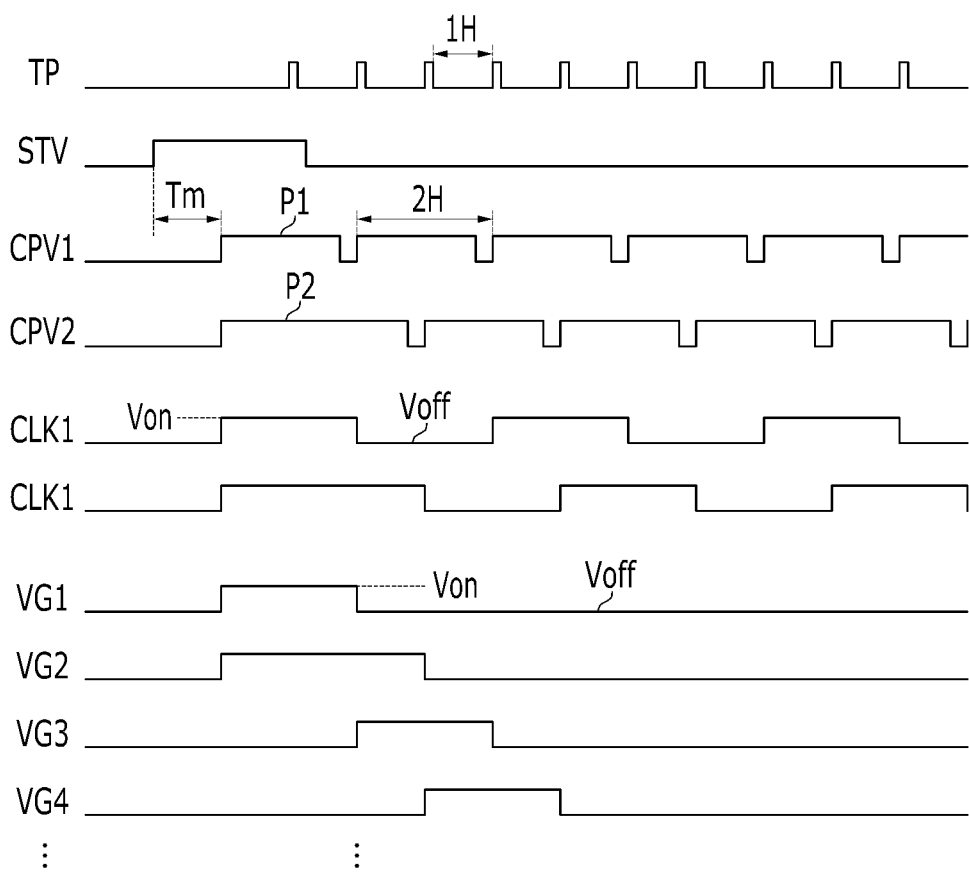

FIGS. 7 and 8 are respective timing charts of a driving signal of a display device, according to exemplary embodiments. It is noted that the timing charts of FIGS. 7 and 8 may be associated with display devices configured substantially similar to the display device previously described in association with FIGS. 1-6. As such, duplicative descriptions are avoided to prevent obscuring exemplary embodiments described herein.

A display device, according to the present exemplary embodiments, may be a display device that includes the gate clock signal modulating unit 650 as described in association with FIG. 5. As such, FIG. 7 illustrates an example in which the number of gate clock signals CPV1, CPV2, and CPV3 is three, whereas FIG. 8 illustrates an example in which the gate clock signals CPV1 and CPV2 is two.

Like the above-described exemplary embodiments described in association with FIGS. 5 and 6, when a first initial gate clock signal CPV1*i* and second initial gate clock signals CPV2*i* and CPV3*i* are input to the gate clock signal modulating unit 650, a width of a pulse that overlaps the high period of a scanning start signal STV is independently modulated from the remaining period, such that the second gate clock signals CPV2 and CPV3 having an increased width of the pulse that overlaps the scanning start signal STV are output. The first gate clock signal CPV1 may be equal to a first initial gate clock signal CPV1*i*.

FIGS. 7 and 8 illustrate an example in which a length of an overlapping period of the high period of the scanning start signal STV and pulses P2 and P3 of the second gate clock signals CPV2 and CPV3 is equal to a length of an overlapping period of the high period of the scanning start signal STV and a pulse P1 of the first gate clock signal CPV1. A width of the pulse P2 of the second gate clock signal CPV2 that overlaps the pulse of the scanning start signal STV may be larger than a width of the pulse P1 of the first gate clock signal CPV1 that overlaps the pulse of the scanning start signal STV. The difference in the pulse widths of the pulse P1 and the pulse P2 may be approximately a horizontal period, e.g., 1H. Further, a width of the pulse P3 of the second gate clock signal CPV3 that overlaps the pulse of the scanning start signal STV illustrated in FIG. 7 may be larger than a width of the pulse P2 of the second gate clock signal CPV2 that overlaps the pulse of the scanning start signal STV. The difference between the widths of the pulse P3 and the pulse P2 may be approximately a horizontal period, e.g., 1H. It is noted, however, that the rising times of the pulses P1, P2, and P3 of the gate clock signal CPV1, CPV2, and CPV3 in a period where the pulses P1, P2, and P3 overlap the pulse of the scanning start signal STV may be substantially equal to each other.

Cycles of the pulses of the first and second gate clock signals CPV1, CPV2, and CPV3 as illustrated in FIG. 7 may be approximately 3H, but exemplary embodiments are not limited thereto. In this manner, the duty ratios of the first and second gate clock signals CPV1, CPV2, and CPV3 are not limited to those illustrated in FIG. 7, but may be any suitable duty ratios. Cycles of the pulses of the first and second gate clock signals CPV1 and CPV2 as illustrated in FIG. 8 may be approximately 2H, but exemplary embodiments are not limited thereto. In this manner, duty ratios of the first and second gate clock signals CPV1 and CPV2 are not limited to those illustrated in FIG. 8, but may be any suitable duty ratios. Further, a time interval Tm of the rising time of the pulse of the scanning start signal STV and a rising time of the pulse P1 of the first gate clock signal CPV1 that overlaps the pulse of the scanning start signal STV may be approximately 1H or longer.

According to exemplary embodiments, the first and second gate clock signals CPV1, CPV2, and CPV3, which are generated as described above, are input to the above-described clock signal generator 750, and the clock signal generator 750 generates a plurality of clock signals CLK1, CLK2, and CLK3 based on the first and second gate clock signals CPV1, CPV2, and CPV3. In a period where the clock signals CLK1, CLK2, and CLK3 do not overlap the pulse of the scanning start signal STV, phases of the clock signals CLK1, CLK2, and CLK3 are different from each other. Further, even though not illustrated, the clock signal generator 750 may further generate a clock signal CLKB1 whose phase difference from the clock signal CLK1 is 180 degrees and a clock signal CLKB2 whose phase difference from the clock signal CLK2 is 180 degrees. Further, according to exemplary embodiments associated with FIG. 7, the clock signal generator 750 may further generate a clock signal CLKB3 whose phase difference from the clock signal CLK3 is 180 degrees. To this end, a duty ratio of each clock signal CLK1, CLK2, and CLK3 may be approximately 50%, but is not limited thereto.

A gate driver 400 receives the plurality of clock signals CLK1, CLK2, and CLK3 from the clock signal generator 750, a gate-off voltage Voff from a gate voltage generator 700, and a gate control signal CONT1 from a signal controller 600 to generate a gate signal based thereon.

In exemplary embodiments associated with FIG. 7, gate signals VG1, VG2, and VG3 output from the first three stages 410 may be synchronized with a pulse that overlaps a pulse of the scanning start signal STV, among the pulses of the gate clock signals CPV1, CPV2, and CPV3 or clock signals CLK1, CLK2, and CLK3. That is, the rising times of the gate signals VG1, VG2, and VG3 output from the first three stages 410 are synchronized with each other. A width of the pulse of the third gate signal VG3 may be larger than a width of the pulse of the second gate signal VG2, and a width of the pulse of the second gate signal VG2 may be larger than a width of the pulse of the first gate signal VG1.

In exemplary embodiments associated with FIG. 8, gate signals VG1 and VG2 output from the first two stages 410 may be synchronized with a pulse that overlaps the pulse of the scanning start signal STV, among the gate clock signals CPV1 and CPV2 or clock signals CLK1 and CLK2. That is, the rising times of the gate signals VG1 and VG2 output from the first two stages 410 are synchronized with each other, and a width of the pulse of the second gate signal VG2 may be larger than a width of the pulse of the first gate signal VG1.

According to exemplary embodiments, gate-on voltages Von of the gate signals VG2 and VG3 output from the second or third stage 410 among the first several stages 410 to which the pulse of the scanning start signal STV is input have sufficient potentials and a charging rate of the pixel PX that is connected to the second or third stage 410 and a pixel PX of a subsequent row may be increased.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device, comprising:
a display panel comprising gate lines and pixels connected to the gate lines via respective switching elements;
a gate driver comprising stages configured to output gate signals to the gate lines;
a gate clock signal modulating unit configured to modulate an input gate clock signal based on a scanning start signal to generate an output gate clock signal; and
a gate clock signal generator configured to generate a clock signal based on the output gate clock signal and output the clock signal to the gate driver,
wherein the gate clock signal modulating unit is configured to modulate a width of a pulse of the input gate clock signal overlapping a pulse of the scanning start signal.

2. The display device of claim 1, wherein:
the input gate clock signal comprises:
a first input gate clock signal; and
a second input gate clock signal, a phase of the second input gate clock signal being slower than a phase of the first input gate clock signal;
the gate clock signal modulating unit is configured to:
output the first input gate clock signal as a first output gate clock signal; and
modulate the second input gate clock signal to output the modulated second input gate clock signal as a second output gate clock signal; and
the second output gate clock signal comprises:
a first pulse overlapping the pulse of the scanning start signal; and
a second pulse, a width of the first pulse being different from a width of the second pulse.

3. The display device of claim 2, wherein:
the second output gate clock signal is substantially the same as the second input gate clock signal in a portion outside the pulse of the scanning start signal.

4. The display device of claim 3, wherein:
a rising time of a pulse of the first output gate clock signal is substantially synchronized with a rising time of the second output gate clock signal in a portion overlapping the pulse of the scanning start signal.

5. The display device of claim 4, wherein:
the first output gate clock signal is substantially the same as the first input gate clock signal.

6. The display device of claim 5, wherein:
the stages comprise at least two stages configured to receive the scanning start signal.

7. The display device of claim 6, wherein:
the gate driver is integrated in the display panel.

8. The display device of claim 4, wherein:
the gate clock signal modulating unit comprises at least one OR circuit.

9. The display device of claim 8, wherein:
the at least one OR circuit is configured to receive and logically sum the first input gate clock signal and the second input gate clock signal to generate the second output gate clock signal.

10. The display device of claim 9, wherein:
the at least one OR circuit is configured to operate in accordance with a control signal; and
the control signal comprises the scanning start signal or a signal substantially synchronized with the scanning start signal.

11. The display device of claim 10, wherein:
the at least one OR circuit is configured to logically sum the first input gate clock signal and the second input gate clock signal in a period when the scanning start signal is in a relatively high state.

12. The display device of claim 11, wherein:
the stages include at least two stages configured to receive the scanning start signal.

13. A method of driving a display device, the method comprising:
modulating an input gate clock signal based on a scanning start signal to generate an output gate clock signal;
generating a clock signal based on the output gate clock signal; and
generating a gate signal based on the clock signal,
wherein generating the output gate clock signal comprises:
modulating a width of a pulse of the input gate clock signal overlapping a pulse of the scanning start signal.

14. The method of claim 13, wherein:
the input gate clock signal comprises:
a first input gate clock signal, and
a second input gate clock signal, a phase of the second input gate clock signal being slower than a phase of the first input gate clock signal;
generating the output gate clock signal comprises:
generating a first output gate clock signal from the first input gate clock signal; and
modulating the second input gate clock signal to generate a second output gate clock signal; and
the second output gate clock signal comprises:
a first pulse overlapping the pulse of the scanning start signal; and
a second pulse, a width of the first pulse being different from a width of the second pulse.

15. The method of claim 14, wherein:
the second output gate clock signal is substantially the same as the second input gate clock signal in a portion outside the pulse of the scanning start signal.

16. The driving method of claim 15, wherein:
a rising time of a pulse of the first output gate clock signal is substantially synchronized with a rising time of the second output gate clock signal in a portion overlapping the pulse of the scanning start signal.

17. The driving method of claim 16, wherein:
the first output gate clock signal is substantially the same as the first input gate clock signal.

18. The driving method of claim 16, wherein:
generating the output gate clock signal comprises receiving and logically summing the first input gate clock signal and the second input gate clock signal to generate the second output gate clock signal.

19. The driving method of claim 18, wherein:
generating of the second output gate clock signal comprises logically summing the first input gate clock signal and the second input gate clock signal in accordance with a control signal; and
the control signal comprises the scanning start signal or a signal substantially synchronized with the scanning start signal.

20. The driving method of claim 19, wherein:
generating the second output gate clock signal comprises logically summing the first input gate clock signal and the second input gate clock signal during a period when the scanning start signal is in a relatively high state.

* * * * *